United States Patent [19]

Smith et al.

[11] Patent Number: 5,028,825
[45] Date of Patent: Jul. 2, 1991

[54] SELF-POWERED SCR GATE DRIVE CIRCUIT WITH OPTICAL ISOLATION

[75] Inventors: Christopher A. Smith, Manassas; George K. Woodworth, Gainesville, both of Va.

[73] Assignee: International Business Machines Corporation, Armonk, N.Y.

[21] Appl. No.: 423,090

[22] Filed: Oct. 18, 1989

[51] Int. Cl.$^5$ .............................................. H03K 17/72
[52] U.S. Cl. ................................... 307/643; 307/311; 307/638
[58] Field of Search ............... 307/311, 643, 647, 648, 307/638, 639

[56] References Cited

U.S. PATENT DOCUMENTS

| | | |
|---|---|---|
| 3,766,409 | 10/1973 | Shuey .................................. 307/643 |
| 4,217,618 | 8/1980 | Kellenbenz et al. . |
| 4,363,064 | 12/1982 | Billings et al. . |
| 4,413,193 | 11/1983 | Crockett . |
| 4,554,463 | 11/1985 | Norbeck et al. . |

Primary Examiner—John Zazworsky
Attorney, Agent, or Firm—Mark A. Wurm; John E. Hoel

[57] ABSTRACT

The improved gate drive circuit provides a continuous gate current whenever there is sufficient anode-to-cathode voltage difference across the SCR. This approach described herein eliminates the need to monitor and reapply SCR gate current after each commutation due to load current distortions. Previous SCR gate driver designs used a pulse train of gate currents to provide a means of keeping the SCRs turned on. The pulsed gate control approach has gaps in the SCR's operation and requires significant circuitry that dissipates much more drive energy. Energy for this improved driver circuit is derived from the SCR anode-to-cathode voltage differential. This eliminates the need for individual power supplies to provide isolated gate signals for each SCR. This self-powering feature reduces the intricacy of controlling multiple SCRs in multi-phase or unreferenced power systems. Flexibility provided by this method allows high power SCRs to be directly interfaced to a digital processor-type controller.

3 Claims, 2 Drawing Sheets

SELF-POWERED SCR GATE DRIVE CIRCUIT WITH OPTICAL ISOLATION

BACKGROUND OF THE INVENTION

1. Technical Field

The invention disclosed broadly relates to power circuits and more particularly relates to SCR power circuits.

2. Background Art

Switching a silicon controlled rectifier (SCR) in high power applications requires precise control of the SCR's current to insure proper timing of the device turn-on. Large systems operating from a power line frequently have reactive and electronic loads that cause distortion of the current and voltage waveforms. Polarity reversals of the load current due to this distortion cause undesirable mid-cycle commutation or turn-off of the SCR.

Isolation and control of an SCR has frequently been accomplished in the prior art with a transformer to couple energy between the SCR gate and its controller. Individual drive transformers required for each SCR gate increases the complexity of this prior art driver circuit approach. Transformer gate drivers add significant size and weight to a design and cannot sustain a continuous DC drive signal. The need to resupply gate signals at a high pulse rate places severe performance limits on prior art transformer designs for SCR drive systems.

OBJECTS OF THE INVENTION

It is therefore an object of the invention to provide an SCR gate drive circuit which provides precise control of the SCR's current in order to insure proper timing of the device turn-on.

It is a further object of the invention to provide a self-powered SCR gate drive circuit which has a significantly reduced size and weight.

It is yet a further object of the invention to provide a self-powered SCR gate drive circuit which can maintain predetermined maximum output drive current.

It is still a further object of the invention to provide a self-powered SCR gate drive circuit which has a high voltage isolation characteristic between the control input and the output by means of opto-electronic coupling.

SUMMARY OF THE INVENTION

These and other objects, features and advantages of the invention are accomplished by the self-powered SCR gate drive circuit disclosed herein. The improved gate driver circuit provides a continuous gate current whenever there is sufficient anode-to-cathode voltage difference across the SCR. This approach described herein eliminates the need to monitor and reapply SCR gate current after each commutation due to load current distortions. Previous SCR gate driver designs used a pulse train of gate currents to provide a means of keeping the SCRs turned on. The pulsed gate control approach has gaps in the SCR's operation and requires significant circuitry that dissipates much more drive energy.

Energy for this improved driver circuit is derived from the SCR anode-to-cathode voltage differential. This eliminates the need for individual power supplies to provide isolated gate signals for each SCR. This self-powering feature reduces the intricacy of controlling multiple SCRs in multi-phase or unreferenced power systems. Flexibility provided by this method allows high power SCRs to be directly interfaced to a digital processor-type controller. High voltage isolation is provided by use of opto-electronic coupling at the circuit control input.

BRIEF DESCRIPTION OF THE DRAWINGS

These and other objects, features and advantages of the invention will be more fully appreciated with reference to the accompanying figures.

DESCRIPTION OF THE BEST MODE FOR CARRYING OUT THE INVENTION

Figure 1:
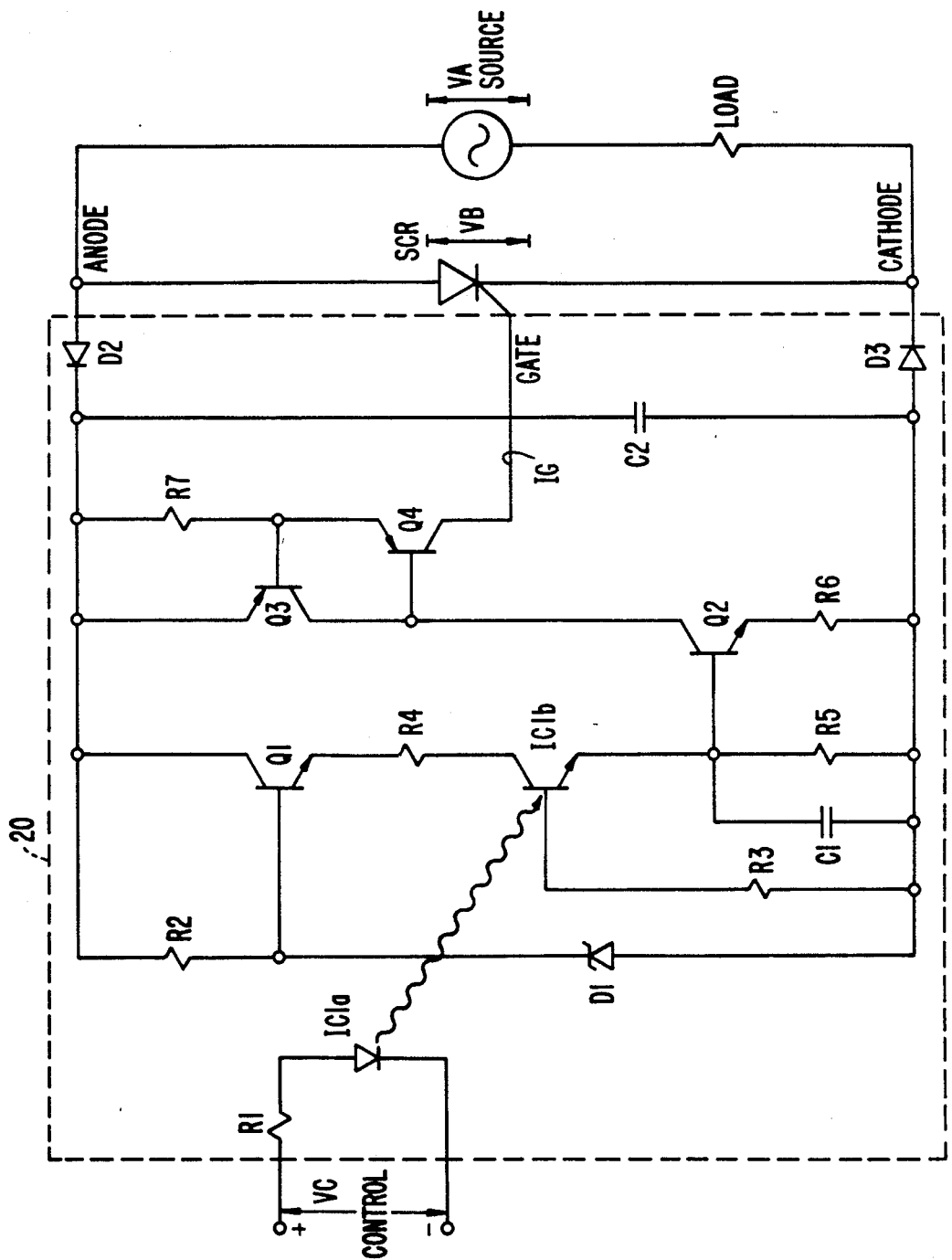
FIG. 1 is a circuit schematic diagram of the self-powered SCR gate drive circuit invention.

The improved gate driver circuit 20 of FIG. 1, provides a continuous gate current whenever there is sufficient anode-to-cathode voltage difference across the SCR. This approach described herein eliminates the need to monitor and reapply SCR gate current after each commutation due to load current distortions. Previous SCR gate driver designs used a pulse train of gate currents to provide a means of keeping the SCRs turned on. The pulsed gate control approach has gaps in the SCRs' operation and requires significant circuitry that dissipates much more drive energy.

Energy for this improved driver circuit 20 is derived from the SCR anode-to-cathode voltage differential. This eliminates the need for individual power supplies to provide isolated gate signals for each SCR. This self-powering feature reduces the intricacy of controlling multiple SCRs in multi-phase or unreferenced power systems. Flexibility provided by this method allows high power SCRs to be directly interfaced to a digital processor-type controller.

The anode-to-cathode voltage required to energize this design is about four volts and is primarily governed by the SCR gate characteristics. The gate driver circuit consisting of transistors Q1-Q4 derives its power from the anode and cathode terminals of the SCR. When there is a potential difference across the anode and cathode of the SCR, and when the control input is on at the input transistor IC1b, current will flow through the transistors Q1-Q4 and there will be some power dissipation. However, once the SCR becomes conducting, the anode-to-cathode potential across it goes substantially to zero volts. In this condition, since there is substantially no potential difference across the gate drive circuit, no current will be flowing through transistors Q1-Q4 and there will be substantially no power dissipation in the circuit. Alternately, when there is no input signal applied to the base of the input transistor IC1b, and when there is a positive potential difference across the anode and cathode terminals of the SCR, there will be some small leakage current passing through the transistors Q1-Q4 which will provide a very small power dissipation. It should be noted that the diodes D2 and D3 are poled so that when there is a negative potential difference across the anode and cathode terminals of the SCR, no current will be conducted and this will prevent any reverse current passing through the gate drive circuit. During conduction, the SCR has a voltage drop of about two volts, anode-to-cathode, which effectively shunts all load energy around the driver circuit, eliminating dissipation within the driver components.

The driver circuitry is optically isolated from the low voltage point signal circuitry by a photo transistor. This technique is especially desirable in high voltage applications and when the power system "ground" or neutral is unreferenced. The optical isolator provides the electrical isolation barrier between the high voltage power circuits and the low voltage input control signal. The SCR gate current is derived from the voltage differential between the anode and cathode of the SCR. The amplitude of this source voltage varies from zero to a maximum sine wave voltage value of 175 volts in the circuits tested. The wide variations in this source voltage require control circuits to limit the drive current impressed on the SCR gate terminal.

Gate drive is limited to provide a regulated gate current regardless of the applied sine wave voltage amplitude, above a minimum value of about four volts. The current regulator Q3, Q4 and R7 in the circuit tested was set for 80 milliamperes of gate current over an input range of four to 175 volts. The operational description of the entire gate driver design is given below.

In FIG. 1, the base of the output transistor Q4 is pulled low by transistor Q2, to supply a drive signal to the gate of the SCR. Transistor Q3, in combination with resistor R7, limits the current through Q4 by forming a limiter to "steal" base drive from Q4, if the current in R7 exceeds the desired current (80 milliamperes) limit. This assures proper gate current to the SCR, fixed in amplitude regardless of the potential across the SCR. Over-driving the gate of the SCR is undesirable as it causes excessive dissipation at the gate and can lead to failure of the SCR. Unregulated SCR gate drive places greater stress upon the drive components and drastically limits the operating voltage range which the design can tolerate.

Transistor Q1 and resistor R2 act as a 15 volt regulator, limiting the internal operating voltage below the rated voltage range of the output transistor in the optocoupler IC1b. This value is approximately equal to the zener voltage of diode D1; 15 volts in this circuit.

The magnitude of resistor R1 is selected so that the input current through IC1a is at an effective operating level. When the input LED of IC1a is supplied current from a control source, the output transistor IC1b is turned on by the photo current and conducts the 15 volt power from Q1 through a limiting resistor R4, turning on the NPN transistor Q2. To minimize the effects of leakage and stray photo currents, shunting resistor R5 is added to bypass the base of Q2 and R3 bypasses IC1b's base. C1 is a timing capacitor selected to adjust the response of the drive signal, and to filter out noise energy picked up in the wiring of the driver circuit.

When the control signal is inactive, no photo current is available to the output transistor of IC1b and it becomes nonconducting. Resistor R3 drains charge off the opto transistor (IC1b) base, insuring that it remains off. This turns off Q2. With Q2 off, there is no current path for Q4's base and it remains off. Q4 interrupts the flow of gate current to the SCR which allows it to commutate naturally and switch off the power available to the load when the anode-to-cathode voltage on the SCR passes through zero.

Diodes D2 and D3 provide reverse polarity blocking for the driver circuit during the period that the source sine wave has reversed in polarity and the SCR is not able to conduct current. C2 is a small filter capacitor to reduce voltage spikes impressed on the driver circuit from the noise pickup on the power control wiring and SCR terminals.

In the circuit 20 of FIG. 1, there are two input signal leads that are connected to IC1a's LED diode and three output leads to pick up power from and provide gate drive to the SCR. The small physical size, low parts count, and minimal power dissipation allow circuit 20 to be included in the packaging of an SCR component body. This would reduce noise, complexity and the real estate needed to implement these SCRs in the design of new equipment.

Figure 2:
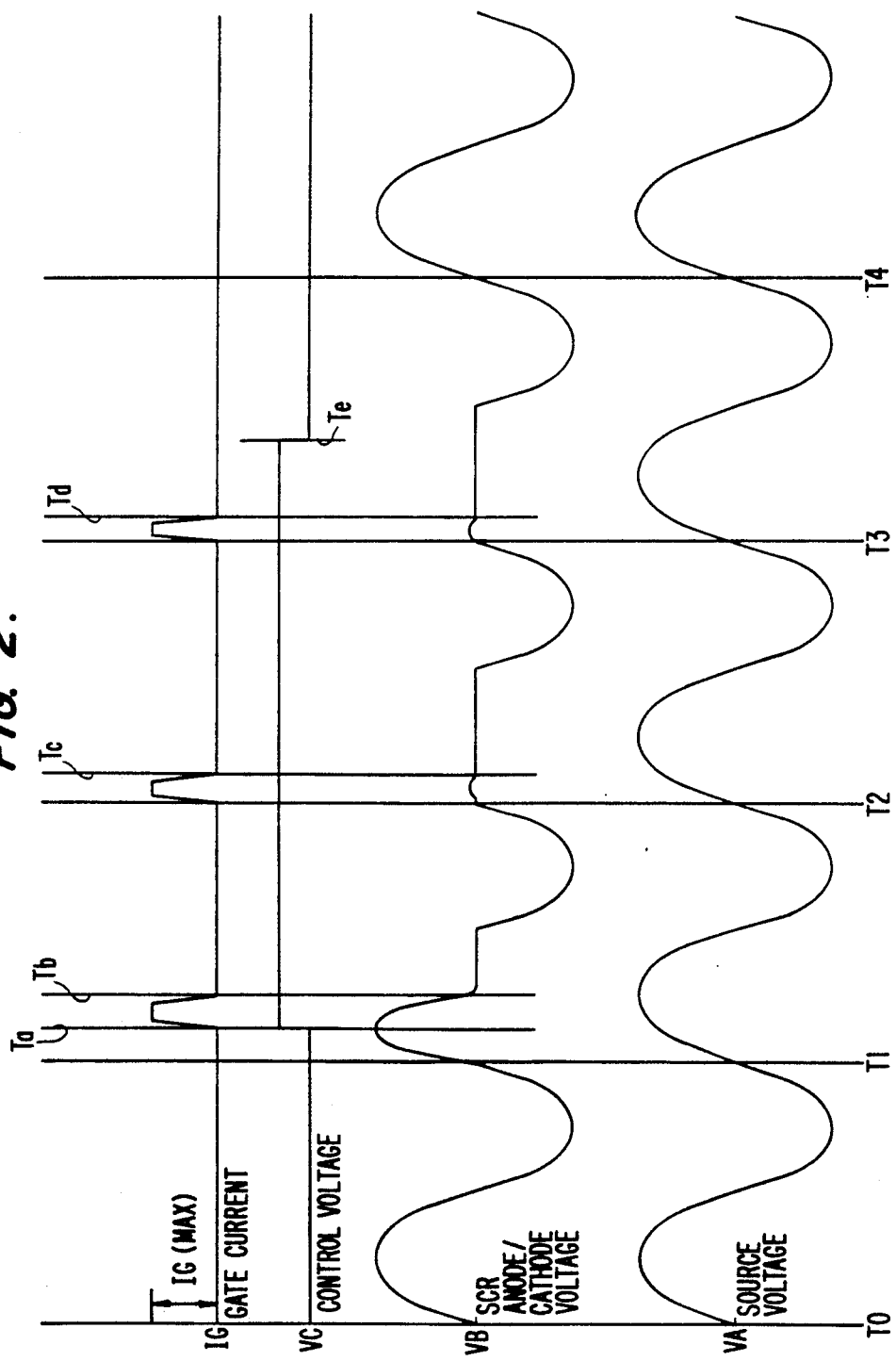
FIG. 2 is a waveform diagram which shows the load voltage waveforms for a source voltage VA, SCR anode-to-cathode voltage VB, control voltage VC and gate current IG.

FIG. 2 has waveform diagrams for the source voltage VA, the SCR anode-to-cathode voltage VB, the control voltage VC and the gate current IG for five consecutive periods for the source voltage waveform. In particular, FIG. 2 illustrates the operation of the invention during a turn-on of the control voltage at the time TA and the turn-off of the control voltage at the time TE. During the interval between TA and TE, it can be seen that the gate current IG will have positive going current pulses which provide a gate drive for the SCR. During the first period of the source voltage sine waveform between T0 and T1, the control voltage VC is off and therefore the SCR is not conducting and therefore, if there is no reactance in the load, the SCR anode-to-cathode voltage will follow the source voltage as can be seen in FIG. 2. During this interval, the gate current IG is zero.

During the next period from T1 to T2, the control voltage VC will turn on at time TA. The control voltage will cause the LED in IC1a to illuminate the base of the photo transistor IC1b thereby causing a current to flow into the base of the transistor Q2. This makes Q2 conductive, thereby drawing current through the transistor combination Q3 and Q4. Q3 and Q4 operate as current regulators with the resistor R7, so that a maximum value current IG(MAX) is output from the collector of the transistor Q4 and applied as the gate current to the SCR. In accordance with the invention, the source potential at the anode and cathode of the SCR is also applied to the gate drive circuit 20 between the emitter of Q3 and the emitter of Q2. Thus, when there is a positive potential difference across the gate drive circuit 20, the gate current IG(MAX) flows as the gate current to the SCR. As can be seen in FIG. 2, the gate current turns on at approximately the time TA and will continue to flow at a value of IG(MAX) until a later time TB when the SCR anode-to-cathode voltage VB drops to zero due to the conduction of current through the substantially zero impedance represented by the ON state of the SCR. During the remaining portion of the positive going part of the waveform VA in the period from T1 to T2, the SCR anode-to-cathode voltage VB will be substantially zero. Since the SCR only conducts from anode to cathode, during the negative going portion of the waveform for the source voltage between T1 and T2, the VB follows the negative waveform as can be seen in FIG. 2.

In the third interval between T2 and T3, as the source voltage VA at time T2 transitions from negative to positive, the positive potential difference from the source is applied across the gate drive circuit 20 causing the gate current IG to flow and reach its maximum value IG(MAX) and it will flow until the SCR is turned on by the gate drive current, thereby causing the potential difference across the gate drive circuit 20 to drop to zero. This small positive deflection in the SCR voltage VB can be seen between the time T2 and TC, after which VB returns to zero for the remaining positive going portion of the source voltage waveform VA. Similarly in the fourth period between T3 and T4, the SCR anode-to-cathode voltage VB goes positive for a short duration during which interval between T3 and TD, the gate current goes to its maximum value IG(-MAX) and then at TD the gate current returns to zero as the SCR becomes fully conductive.

In the interval between T3 and T4, at the time TE the control voltage VC is selectively returned to zero voltage. Since the SCR is conducting current from its anode to its cathode, it will continue to conduct current substantially as long as the source voltage VA continues to apply a positive potential difference across the SCR. As the source voltage VA goes into its negative going half cycle, the SCR turns off and will remain off thereafter. This can be seen at the time T4 when the source voltage VA transitions from negative to positive. Since the control voltage VC is off, there is no possibility for the gate current IG to be applied to the SCR. Therefore the SCR will not turn on notwithstanding the fact that a positive potential is being applied across its anode and cathode. Thus as can be seen in FIG. 2, the voltage VB now follows the waveform for the source voltage VA.

The resulting circuit has a number of advantageous features. The optocoupler embodied in the LED IC1a and the photo transistor IC1b provides a significant isolation between the control voltage VC and the operation of the SCR. The operation of the gate drive circuit 20 provides a maximum current IG(MAX) for the gate current, thereby prohibiting the application of spurious large spikes to the gate electrode of the SCR. The gate drive circuit 20 is self-powered in that it derives its power from the voltage source which is also driving the load. This enables the elimination of additional transformer power elements which are bulky, occupy space and have weight, and cost substantial sums of money. Still further, although the source voltage waveform VA shown in FIG. 2 is a sinusoidal waveform, many other waveforms can be applied to the anode and cathode terminals in the circuit of FIG. 1. Indeed, for whatever application in which one can apply an SCR, the gate drive circuit 20 can also be applied. This would include DC circuits and a variety of source voltage waveform applications.

The resulting self-powered SCR gate drive circuit provides a continuous gate current whenever there is sufficient anode cathode voltage difference across the SCR. This eliminates the need for individual power supplies to provide isolated gate signals for each SCR. The flexibility provided by this invention allows high powered SCRs to be directly interfaced to a digital processor, for example.

The invention provides the feature of active current limiting for the gate drive signal. It provides a constant current source character to the gate drive signal of the circuit. The gate driver invention may trigger the SCR any time the voltage across the SCR is of a proper polarity and sufficient magnitude to power the drive circuit and is not limited to merely a zero voltage turn-on. The invention disclosed herein enables the SCR to be capable of operation under the entire range of zero to 180 degrees of conduction. The SCR gate drive provided by the invention disclosed herein is maintained at a controlled and regulated level and the internal parts are rated a full "off state" line voltage operation. Still further, the invention regulates the voltage available at the optocoupler with a zener diode and pass transistor to a specified level. Still further, the circuit invention disclosed herein requires its components to be turned on to allow the passage of current to the SCR gate lead, and if any of the components fail, the circuit will not function, a significant safety feature for power circuits. Still further, the circuit invention disclosed herein is intended to limit the gate current to an SCR to a constant value regardless of the line voltage value above a minimum cut-in point. This reduces stress and component dissipation while maintaining adequate gate drive current over the range of operating voltages. This becomes very significant as higher line voltages such as 440 volts are commonly used. The circuit provides the ability to "turn on" when there are only a few volts across the SCR and yet be able to safely turn on when the voltage across the SCR is at a 600 volt level. Still further, the invention uses a reverse blocking diode to prevent any reverse current from passing backwards from the cathode lead through the circuit into the SCR gate driver. This added protection prevents spike signals from falsely firing the gate or from degrading the drive circuits. In summary, the invention provides a self-powered optically isolated SCR gate drive system that provides a regulated gate continuous current signal. Dissipation and leakage current are limited to low levels by the circuit.

Although a specific embodiment has been disclosed, it will be understood by those having skill in the art that changes can be made to that specific embodiment without departing from the spirit and the scope of the invention.

What is claimed is:
1. A self-powered SCR gate drive circuit comprising:
an SCR device having an anode terminal, a cathode terminal and a gate terminal, said anode and cathode terminals connected between a voltage source and a load;
a first PNP bipolar transistor having its emitter coupled through a first diode to the anode terminal of said SCR device, said first diode being poled so that its anode is connected to the anode terminal of said SCR device, the base of said first PNP transistor being connected through a resistor to the cathode of said first diode;
a second PNP bipolar transistor having its emitter connected to said base of said first PNP transistor, its base connected to said collector of said first PNP transistor, and its collector connected to said gate terminal of said SCR device;
a first NPN bipolar transistor having its collector connected to said base of said second PNP bipolar transistor, its emitter connected through a second resistor to the anode of a second diode whose cathode is connected to said cathode terminal of said SCR device, the base of said first NPN bipolar transistor being coupled to a control voltage;
said voltage source applying a potential difference between said emitter of said first PNP bipolar transistor and said emitter of said first NPN bipolar transistor, providing operating power for said drive circuit;
said base of said second PNP bipolar transistor being selectively pulled low by said first NPN bipolar transistor to supply a drive signal to said gate terminal of said SCR device.

2. The self-powered SCR gate drive circuit of claim 1, which further comprises:
- a photo transistor having its emitter-collector path coupled between said base of said first NPN bipolar transistor and said anode terminal of said SCR device, for providing base current to said first NPN bipolar transistor;
- a light emitting diode proximately positioned with respect to said photo transistor, having its anode-cathode path connected to a control signal source, for emitting optical radiation to illuminate said photo transistor in response to said control signal;
- whereby said control signal source is isolated from said SCR device.

3. A self-powered SCR gate drive circuit comprising:
- an SCR device having an anode terminal, a cathode terminal and a gate terminal, said anode and cathode terminals connected between a voltage source and a load;
- a current regulating means coupled between said anode terminal and said cathode terminal on said SCR device having an input terminal and an output terminal comprising:
- a first PNP bipolar transistor having its emitter coupled through a first diode to the anode terminal of said SCR device, said first diode being poled so that its anode is connected to the anode terminal of said SCR device, the base of said first PNP transistor being connected through a resistor to the cathode of said first diode;
- a second PNP bipolar transistor having its emitter connected to said base of said first PNP transistor, its base connected to said collector of said first PNP transistor, and its collector connected to said gate terminal of said SCR device to form said output terminal;
- said output terminal of said current regulating means connected to said gate terminal of said SCR device providing gate drive current to said SCR device in response to an energizing signal at said input terminal to said current regulating means; and
- a photo transistor coupled between said input terminal of said current regulating means and said voltage source for providing said energizing signal to said current regulating means in response to a signal from a source of light;
- a light emitting diode proximately positioned with respect to said photo transistor, having its anode-cathode path connected to a control signal source, for emitting optical radiation to illuminate said photo transistor in response to said control signal;
- said control signal source being optically isolated from said SCR device;
- said current regulating means and said photo transistor being powered by said voltage source.

* * * * *